United States Patent [19]

Sarvary et al.

[11] Patent Number: 4,911,598
[45] Date of Patent: Mar. 27, 1990

[54] ROBOTIC ASSEMBLY APPARATUS WITH ROBOT TOOL FOR PLACING A PLURALITY OF COMPONENT PARTS ON A WORKPIECE

[75] Inventors: Gabor J. A. Sarvary, Skelmorlie; Colin D. Wilson, Largs, both of Scotland

[73] Assignee: International Business Machines Corporation, Armonk, N.Y.

[21] Appl. No.: 313,422

[22] Filed: Feb. 21, 1989

Related U.S. Application Data

[63] Continuation of Ser. No. 171,204, Mar. 17, 1988, abandoned, which is a continuation of Ser. No. 40,005, Apr. 20, 1987, abandoned.

[30] Foreign Application Priority Data

Apr. 28, 1986 [EP] European Pat. Off. ........ 86303188.6

[51] Int. Cl.$^4$ .............................................. B25J 15/06
[52] U.S. Cl. .................................... 414/225; 198/418.1; 198/458; 198/468.3; 294/65; 294/87.1; 414/226; 414/736
[58] Field of Search ............... 414/224, 226, 225, 736, 414/744.3, 752, 744.5, 744.8; 198/345, 346.1, 391, 420, 458, 468.3, 418.2; 294/65, 65.5, 871; 29/740, 741, 832

[56] References Cited

U.S. PATENT DOCUMENTS

| | | | |
|---|---|---|---|
| 3,987,889 | 10/1976 | Godoy | 198/458 X |
| 4,079,829 | 3/1978 | Belyshev | 198/345 |
| 4,336,874 | 6/1982 | Kamphues | 198/458 |
| 4,425,074 | 1/1984 | Becker et al. | 414/736 |
| 4,543,702 | 10/1985 | Wada | 901/7 X |
| 4,579,514 | 4/1986 | Repella | 414/736 X |
| 4,587,703 | 5/1986 | Azizi et al. | 29/431 |
| 4,699,559 | 10/1987 | Bibbo et al. | 414/752 |

FOREIGN PATENT DOCUMENTS 0071303 9/1983 European Pat. Off.

OTHER PUBLICATIONS

Technical Digest-Western Electric, No. 65, Jan. 1982, p. 19, Author W. C. Kent New York, U.S., Robot Arm Pickup Device for Automatic Assembly Machine.

Primary Examiner—Robert J. Spar
Assistant Examiner—Donald W. Underwood
Attorney, Agent, or Firm—Philip J. Feig

[57] ABSTRACT

A robotic assembly apparatus includes a robot (2), a component supply station (6) and at least one placement station (7, 8). Components are correctly orientated by means of feeder bowls (11, 12) and are serially presented to the supply station along tracks (9 and 10). A multi-head tool (5) simultaneously picks up a plurality of correctly orientated components and places them in their correct positions in or on the workpiece. Before or during their travel to the workpiece, the plurality of components are placed in their correct positions relative to one another. Preferably two placement stations are used per robot so that one can be used for removing an assembled workpiece and supplying a new workpiece while the other is having components inserted. The multi-head tool (5) consists of individually-pneumatically-operable actuators (27) carrying individual-operable component grippers which may be mechanical, vacuum or electromagnetic.

6 Claims, 4 Drawing Sheets

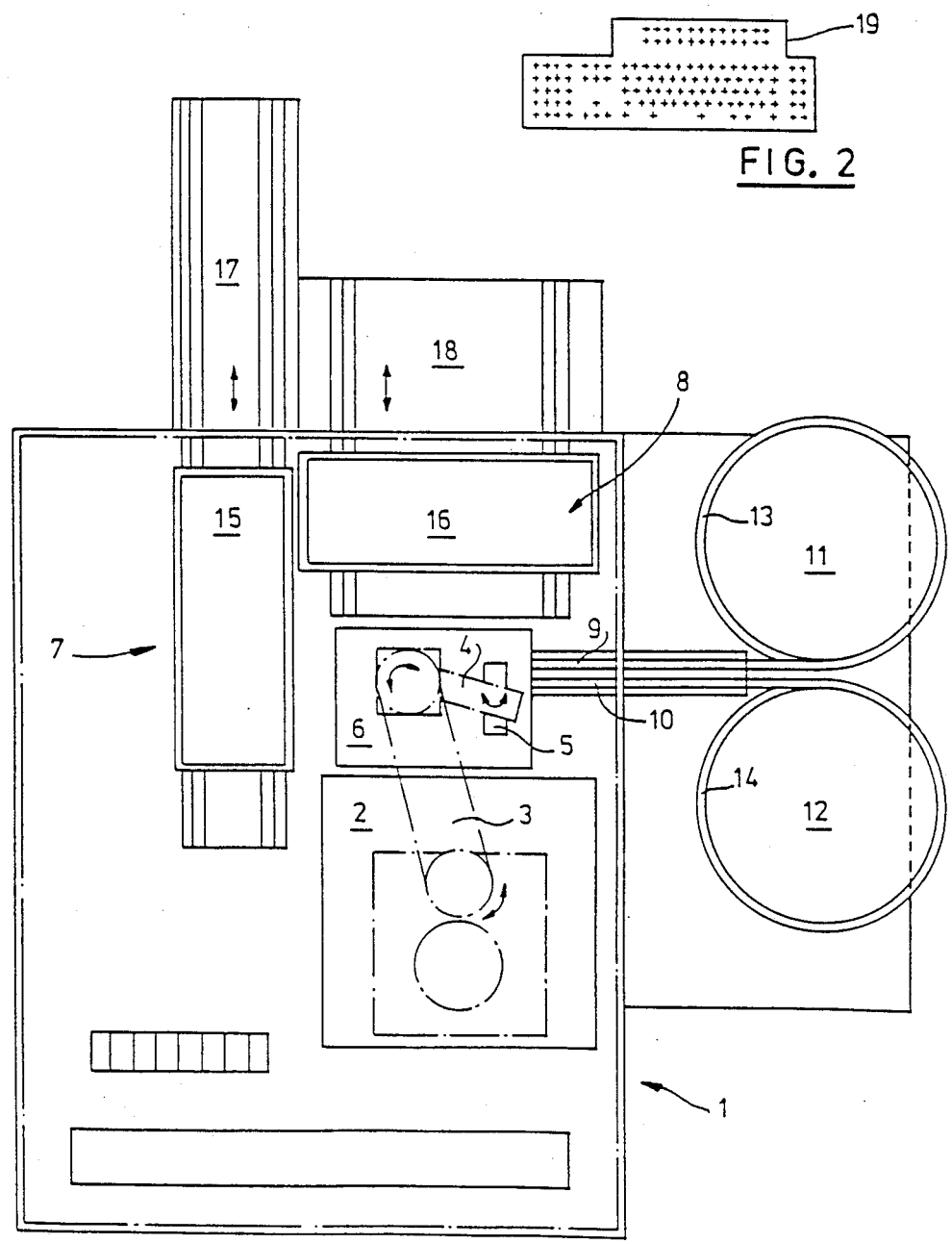
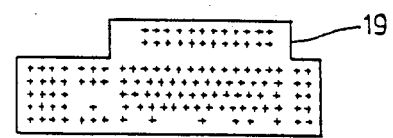
FIG. 2
FIG. 1

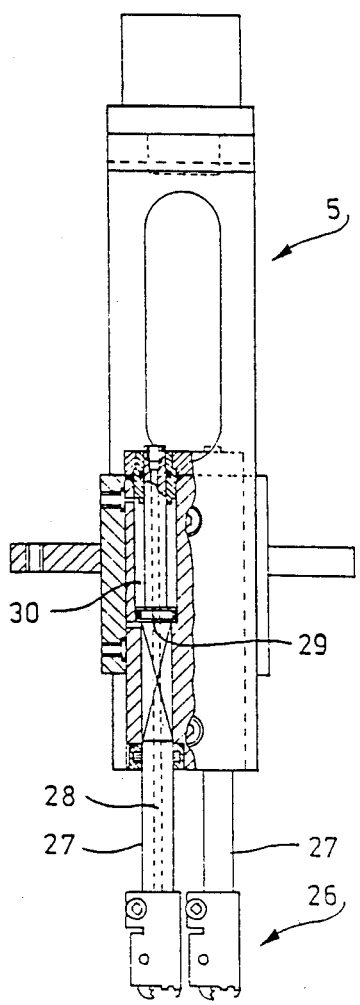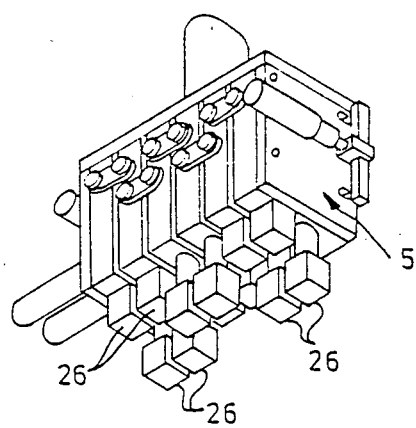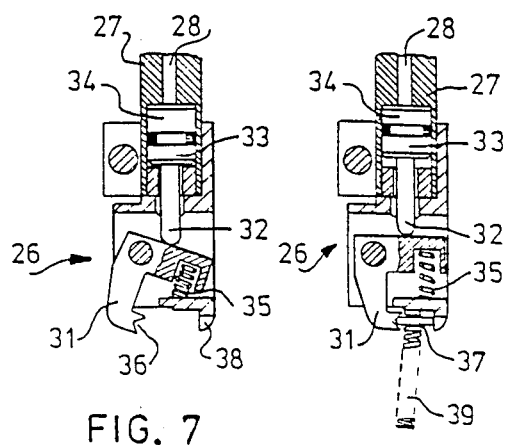
FIG. 5
FIG. 6
FIG. 7
FIG. 8

ROBOTIC ASSEMBLY APPARATUS WITH ROBOT TOOL FOR PLACING A PLURALITY OF COMPONENT PARTS ON A WORKPIECE

This application is a continuation of application Ser. No. 07/171,204 filed Mar. 17, 1988, now abandoned, which was a continuation of application Ser. No. 07/040,005 filed Apr. 20, 1987, now abandoned.

CROSS REFERENCE TO RELATED APPLICATION

This application claims priority under the International Convention for the Protection of Industrial Property, from European patent application Application No. 86303188.6, filed Apr. 28, 1986 in the European Patent Office.

BACKGROUND OF THE INVENTION

1. Field of the Invention

This invention relates to a robotic assembly apparatus having a robot tool for placing a plurality of component parts on a workpiece. The invention is more particularly concerned with a robot tool which allows a plurality of similar parts to be placed simultaneously onto a receiving workpiece in a pattern which may vary in accordance with the particular workpiece.

The invention may advantageously be used in the robotic manufacture of keyboards where keypads, keybuttons or key springs need to be placed on or in a keyboard frame, the pitch between the key buttons etc being dependent upon the particular model of keyboard being manufactured.

2. Description of the Prior Art

In recent year, robots have been increasingly used in automated assembly operations to perform repetitious and generally tedious work. Typically the robot will be presented with a series of workpieces onto or into each of which must be placed a number of components or parts. In its simplest form, the robotic assembly apparatus would serve to place a single type of component part into or onto a single type of workpiece. In a more sophisticated version, a number of robotic assembly apparatus might be served by a single robot but with each robotic assembly apparatus being used to place a single type of component part into or onto a single type of workpiece.

A more flexible arrangement would allow a robot assembly apparatus to deal with a plurality of different types of workpiece with different component parts, a manual, semi-automatic or fully automatic system being used to identify the type (and orientation) of the workpieces and the type (and orientation) of the component parts to be placed therein or thereon. However for maximum benefit a fully automatic system would be required and this in turn implies the need for a complicated and expensive logic and recognition system which may have a consequential detrimental impact on the reliability and serviceability of the equipment. The means by which workpieces and components are correctly orientated and positioned would also be complicated.

SUMMARY OF THE INVENTION

An object of the present invention is to provide a robotic assembly apparatus and robot tool which allow a plurality of similar parts to be placed simultaneously onto or into a workpiece at positions which may vary with the type of workpiece.

According to the invention, a robotic assembly apparatus having a robot tool for placing components in or on a workpiece comprises means for presenting workpieces serially to a placement station, means for presenting components to be placed in or on said workpieces to a supply station, and means for picking up components from said supply station and placing them into or onto a workpiece at said placement station, characterized in that said apparatus further includes means for placing a plurality of components in a predetermined pattern and orientation relative to one another at said supply station, means for simultaneously picking up said orientated plurality of components, means for placing said plurality of components into their correct positions relative to one another, and means for simultaneously placing the plurality of correctly positioned components into or onto said workpiece at said placement station.

In one embodiment of the invention, means is provided for correctly positioning said components relative to one another at said supply station.

In a second embodiment, the components are correctly positioned relative to one another after they have been picked up during their transport to the placement station.

To speed up operation, more than one placement station may be provided, each having its own supply of workpieces. Similarly more than one component supply station may be provided.

Where the number of components to be placed in or on a workpiece exceeds the number of components which can be simultaneously picked up, the operation is repeated until all the desired positions on the workpiece have been filled. Preferably, the number of components which can be picked up at any one time is varied by using a matrix of component lifting heads, each of which is individually operable under program control.

BRIEF DESCRIPTION OF THE DRAWINGS

Although the invention has general application, it will be described, by way of example, with reference to the accompanying drawings, in which:

FIG. 1 is plan view of a robotic assembly apparatus employing two component placement stations and one component supply station;

FIG. 2 is a plan view of a keyboard frame showing the positions where key button components are to be placed;

FIG. 5 is a schematic of a multi-head robot pick-up tool;

FIGS. 6 to 8 show details of a mechanical gripper or pick-up arrangement, and

DESCRIPTION OF THE PREFERRED EMBODIMENTS

Figure 4:
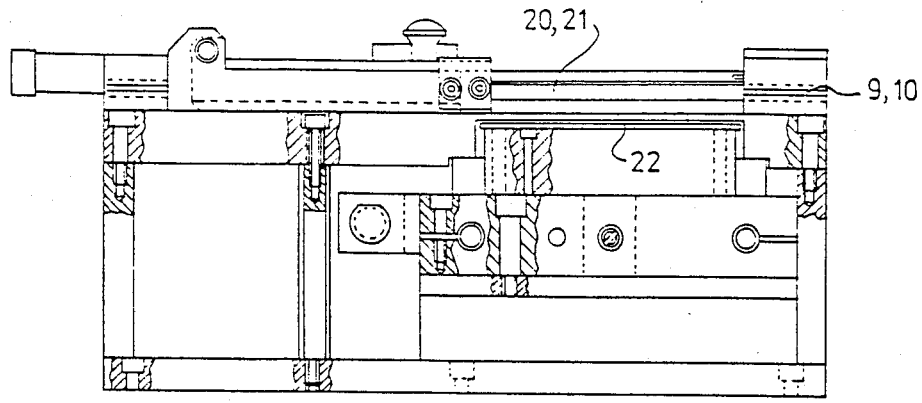
FIG. 4 is a side view of the component supply station.

Referring now to FIG. 1, a robotic assembly apparatus —generally indicated at 1 in plan view—consists of a robot 2, for example an IBM 7545 robot, having arms 3 and 4 by means of which a multi-head gripping tool 5 can be moved from the position shown over a component supply station 6 to either of two component placement stations 7 and 8. Component parts are fed serially to the station 6 along linear feeders 9 and 10 in their correct orientation. The feeders 9 and 10 are supplied in turn from vibrating bowl feeders 11 and 12 respectively. Vibrating bowl feeders are known, per se, and will not be further described: their purpose is to present to the linear feeders 9 and 10 component parts correctly orientated. Specially shaped channels 13 and 14 in the bowl feeders ensure that only correctly-orientated components reach the linear feeders 9 and 10.

Although in the particular embodiment being described, all the component parts are identical, it will be apparent that each bowl feeder may be loaded with parts which are unique to that feeder. In this way a number of different parts can be presented to the supply station 6. Clearly there will need to be at least one supply feeder (9, 10) for each of the different component parts.

Workpieces are carried or presented to the placement stations 7 and 8 on shuttles 15 and 16 respectively along tracks 17 and 18 respectively. The arrangement is normally such that whilst a workpiece on one of the shuttles is having component parts loaded thereon at one placement station, the other shuttle is removing a "completed" workpiece from the other placement station and presenting a new workpiece. This maximizes the operation of the robot 2 which need not spend time waiting for workpieces to be loaded or unloaded which would be the case if only one placement station were used.

FIG. 2 is a schematic showing, in plan view, a keyboard frame 19 (which in use would be carried to the placement positions 7 an 8 on the shuttles 15 and 16) having sites on which keybuttons/keybutton parts are to be located/inserted. It will be seen that although the sites are generally in a matrix, the pitch of the matrix, i.e., the spacings between the keybuttons, is not constant and may vary from model to model of keyboard. The problem is to ensure that each site is populated with the correct component (in the correct position and orientation) in a timely fashion, it not being economic to use the robot to place these parts one at a time. Correct orientation of the component parts is ensured by use of the vibrating feeder bowls 11 and 12, positioning of a plurality of parts simultaneously is ensured by the use of the multi-head gripper tool 5 and correct positioning of the component parts is ensured by ensuring that their positions relative to one another is correct as will be described below.

Figure 3:
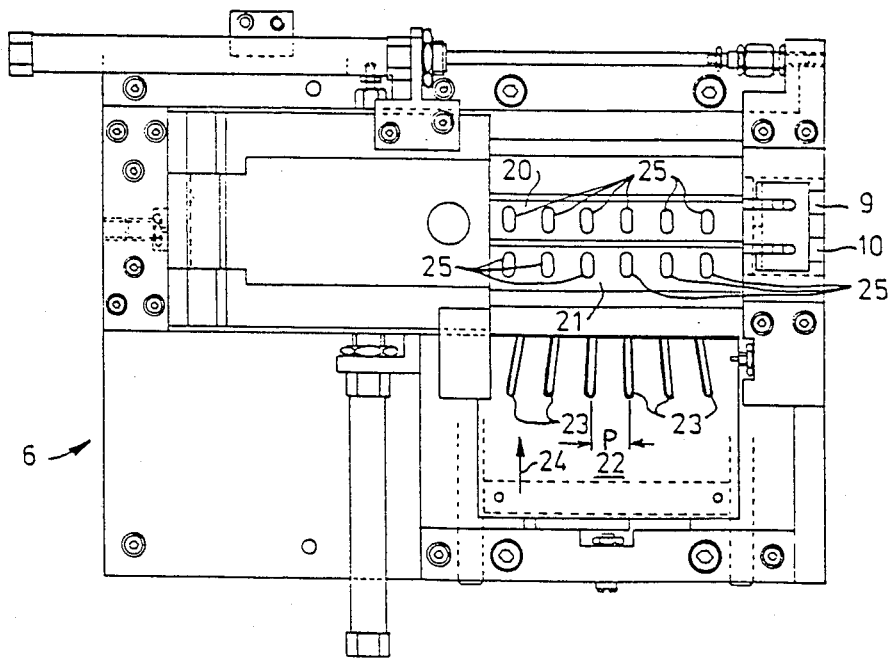
FIG. 3 is a plan view showing a component supply station in more detail.

FIGS. 3 and 4 are plan and side views of the embodiment of the invention in which the component parts are correctly positioned relative to one another at the component supply station 6. As will be recalled from FIG. 1, the components are presented to the station serially in two rows.

Although the spacing between the two tracks 9 and 10 may be arranged to position the components in their correct relative positions in the one direction, in the other orthogonal direction the components will be abutting on another. In the particular arrangement to be described, the component parts to be inserted in the keyboard frame are keypad assemblies, each consisting of a plastic pad with a dependent coil spring (and shown in FIG. 8, reference numerals 37, 39).

Thus the keypads are presented to the supply station along the tracks 9 and 10 which may then converge or diverge into tracks 20 and 21 whose separation is equal to the desired separation of the components. Positioning in the other (orthogonal) direction is performed by a sliding spreader table 22 located beneath the track sections 20 and 21. The spreader table has slots or grooves 23 which fan out from the initial "end-to-end" spacing of the dependent springs to the desired spacing. As the spreader table 22 is moved in the direction of arrow 24 beneath the track sections 20 and 21, the slots 23 will engage with the dependent springs on the keypads and will cause the pads to separate and spread along the tracks to the desired spacing (depending on the pitch P of the grooves or slots 23).

After pick-up of the separated components, the spreader table is withdrawn allowing the next batch of parts to be presented along the tracks 9 and 10 to the track sections 20 and 21. Sensors 25, shown schematically, beneath the track sections 20 and 21 sense for the presence or absence of springs (and hence components) before and after pick-up. As will be described later, the multi-head tool would normally pick up twelve component parts but it can be programmed to pick up any number from 1 to 12 to allow for variations in the pitch of the component positions of the workpiece 19. What has been described is a mechanism that allows component parts to be orientated and correctly positioned relative to one another for simultaneous placement on a workpiece.

The number of parts to be placed at any one time is a function of the number of parts that can be arranged in the correctly positioned and orientated condition and the proportion of those actually picked-up by the multi-head tool 5 or released thereby. FIG. 5 is a schematic of the multi-head tool which, in the embodiment, shown includes twelve grippers 26 arranged in two rows of six each. As shown in FIG. 5, in which six grippers are shown retracted and six extended, each gripper mechanism is separately movable in the vertical direction. Moreover, each gripper can be separately operated so as to grip or release its associated component part. Any suitable gripping mechanism can be used, mechanical, vacuum or electromagnetic depending on the size, nature and weight of the components. Generally the pitch of the matrix of grippers will correspond to the pitch of the component positions on the workpiece. In some instances it may be possible to use a gripper construction/technology which allows for a variation in the "workpiece pitch."

FIGS. 6 to 8 are drawings of a pneumatically operated gripper mechanism 5 employing mechanical grippers 26. As is shown in FIG. 6, each gripper 26 is carried as an actuator 27 having a bore 28. Each actuator 27 can be moved vertically and independently of the other actuators by pneumatic operation of the piston 29 within cylinder 30. In addition to the vertical movement produced by individual movement of the actuator 27, the whole of the assembly 5 is also movable vertically.

Operation of the gripper mechanism 26 can be seen with reference to FIGS. 7 and 8 which shown, respectively, the open and closed positions of a pivotable, gripper jaw 31, opened under the action of a push rod 32, connected to a piston 33 within a cylinder 34, against a return spring 35. A notch 36 on the gripper jaw 31 engages, in the closed position, the edge of the spring pad 37 which is urged against surface 38. Also shown in FIG. 8 is the dependent spring 39 of the spring pad assembly (and which are used by the slots or grooves 23 of the spreader table 22, FIG. 3, to spread the spring pad assembly to the desired spacing).

The invention is not limited to the use of mechanical grippers and as mentioned above, any suitable technique such as vacuum or electromagnetic may be used. FIGS.

9 and 10 show an embodiment of the invention in which the grippers 26 are vacuum holders. To this end the undersides of the grippers are shaped to correspond to keybuttons 40 to be placed on a workpiece. In this case the bores of the actuators 27 are individually and controllably connected to a source of vacuum. As in the case of the arrangement shown in FIGS. 6 to 8, each actuator 27 is individually movable in a substantially vertical direction as is the whole assembly 5.

Figure 9:
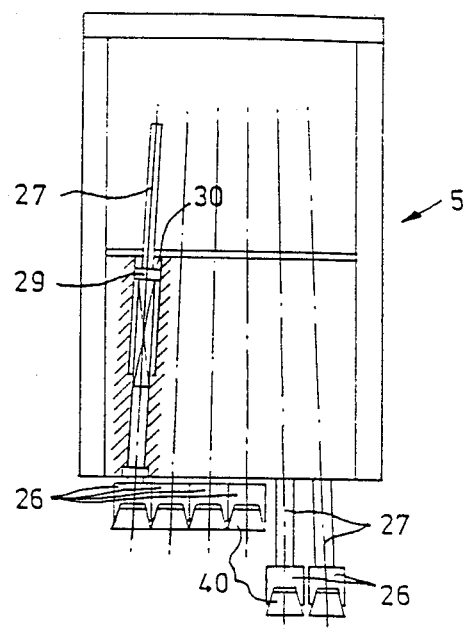
FIGS. 9 to 10 show details of an alternative arrangement of multi-head robot pick-up tool.
Figure 10:
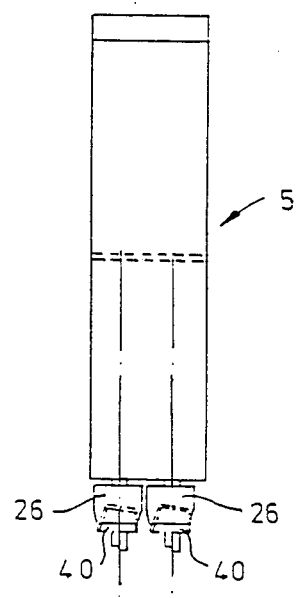

FIG. 9 also serves to illustrate another technique for separating the component parts to desired spacings and which can be used instead of or as well as the spreader table 22 of FIG. 3. As will be seen in FIG. 9, the cylinders 30 (and actuators 27) are angled with respect to one another. As the actuators 27 are moved down, their tips and grippers 26 will separate from one another. The amount of separation will depend upon the angles between the cylinders 30 and actuators 27 and the stroke. In a typical keyboard application, relative angles between the cylinders of 7° mm to 8° mm with a stroke between 2 and 4 cm are generally adequate to accommodate the different pitch requirements.

What has been described is a relatively inexpensive but flexible robotic assembly apparatus employing a robotic tool which enables a plurality of similar components or parts to be simultaneously placed upon a workpiece in their correct orientations and positions. Because the tool is programmable, it is able to execute a number of insertions at different locations from a single pick-up cycle. The robotic assembly apparatus is flexible and relatively uncomplicated but without being constrained to place components one by one on the workpieces.

Without major modification, a number of different types of component can be assembled at the robotic assembly apparatus by presenting the components at the supply station in their correct groups and orientations and thereafter selectively releasing the different parts at the workpiece. Simple programming of the robot and multihead tool allows for different workpieces. Although the invention has been described with reference to keyboard assembly, its principles are clearly applicable to other assembly operations where a plurality of similar parts need to be inserted in or at pre-defined positions on a workpiece, for example populating printed circuit boards.

We claim:

1. A robotic assembly apparatus having a robot tool for placing components in or on a workpiece comprising means (17, 18) for presenting workpieces serially to a placement station (7, 8), means (9, 10) for presenting components to be placed in or on said workpieces to a supply station (6) and means for picking up components from said supply station (6) and placing them into or onto a workpiece at said placement station Ser. No. 07/040,005 and including a plurality of individual grippers (26) each carried by an actuator (27) wherein each gripper is independently operable for the selective pick-up and/or release of components and each actuator is independently movable to a retracted position or an extended position and the actuators are angled with respect to one another whereby their respective gripper may be spaced from one another in a plane orthogonal to the direction of movement of the actuators by an amount dependent upon the angle and the amount of movement of the gripper relative to the tool thereby to position the components relative to one another, means (11, 12, 20, 21) for placing a plurality of components in a predetermined pattern and orientation relative to one another at said supply station, means for placing said components into their correct positions relative to one another, and means for simultaneously placing the plurality of correctly positioned components into or onto said workpiece at said placement station.

2. A robotic assembly apparatus as claimed in claim 1, in which said means for presenting workpieces serially comprises two placement station (7, 8), and means (15, 17; 16, 18) for removing a completed workpiece and supplying a new workpiece to one placement station while components are placed on a workpiece at the other placement station.

3. A robotic assembly apparatus according to claim 1, in which each actuator is pneumatically operable.

4. A robotic assembly apparatus according to claim 1, wherein said means for placing a plurality of components in a predetermined pattern and orientation comprises a plurality of tracks (9, 10), at least one for each type of component to be placed on a workpiece, and means (11 to 14) for ensuring that each component arrives at the supply station in its correct orientation with respect to the other components of the same type, said means for picking up components (5) being adapted to pick up a plurality of components of at least one type each time it removes components from said supply station.

5. A robotic assembly apparatus according to claim 1, in which said grippers (26) comprises vacuum pick-up means.

6. A robotic assembly apparatus according to claim 1, wherein said means for placing a plurality of components in a predetermined pattern and orientation relative to one another at said supply station comprises at least one track section for presenting components serially in abutting relationship along said at least one track section, and said means for placing said components into their correct positions comprises a spreader mechanism including a sliding table having slots which fan out, said slots being disposed for engaging the abutting components for causing while said table is undergoing motion in a direction substantially orthogonal to the track section the components to increasingly spread apart along the track section to their correct non-abutting positions relative to one another during the motion of said table.

* * * * *